(12) United States Patent
Higuchi (10) Patent No.: US 6,646,295 B2
(45) Date of Patent: Nov. 11, 2003

(54) SEMICONDUCTOR DEVICE (75) Inventor: Minoru Higuchi, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/074,138

(22) Filed: Feb. 12, 2002

(65) Prior Publication Data

US 2002/0113256 A1 Aug. 22, 2002

(30) Foreign Application Priority Data

Feb. 22, 2001 (JP) ........................................ 2001-046141

(51) Int. Cl.[7] ............................................... H01L 29/76
(52) U.S. Cl. ........................ 257/288; 257/336; 257/408
(58) Field of Search ................................. 257/288, 314, 257/335, 336, 337, 390, 408; 438/303

(56) References Cited

U.S. PATENT DOCUMENTS 5,227,319 A * 7/1993 Ogura et al.
2003/0022445 A1 * 1/2003 Taniguchi et al. .......... 438/257

FOREIGN PATENT DOCUMENTS

JP          8-181223         7/1996
JP          2000-299390      10/2000

OTHER PUBLICATIONS

English Bibliographies and Abstracts of JP 2000–299390 and JP 8–181223 (cited above).

* cited by examiner

Primary Examiner—Tuan H. Nguyen
(74) Attorney, Agent, or Firm—Darryl G. Walker; Bradley T. Sako (57) ABSTRACT

A semiconductor device including an insulated gate field effect transistor (IGFET) has been disclosed. The IGFET may be formed in an element region defined by an element isolation region (14) formed on a semiconductor substrate (8). A covering portion (10) may cover at least a portion of an end (22) of the element region. Covering portion (10) may be formed essentially of the same material as a side wall (10) of a gate (12) of the IGFET. A source/drain region (18) may be formed using gate (12) and covering portion (10) as a mask. In this way, a distance between an intra-substrate high-concentration contour line (20) and source/drain region (18) in area of end (22) of the element region may remain sufficient and an IGFET breakdown voltage may be improved.

13 Claims, 8 Drawing Sheets

SEMICONDUCTOR DEVICE

TECHNICAL FIELD

The present invention relates generally to a semiconductor device and method for manufacturing the same and more particularly to a semiconductor device that may include a high breakdown-voltage transistor and a method for manufacturing the same.

BACKGROUND OF THE INVENTION

A semiconductor device, such as a non-volatile semiconductor memory device using non-volatile memory cells, can require high voltages to program or erase data in a memory cell. Thus, transistors that can withstand a high voltage are needed.

Figure 8:
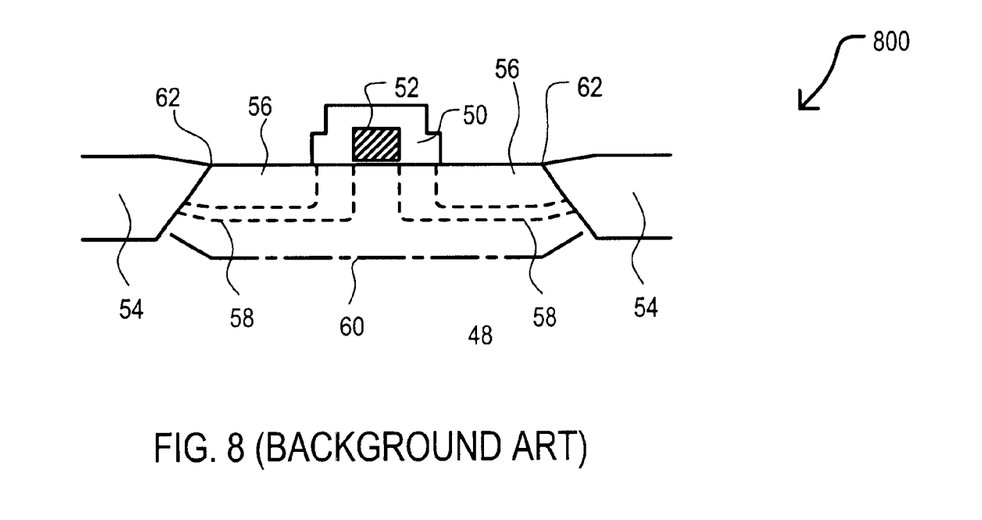
FIG. 8 is a cross-sectional diagram of a conventional high breakdown-voltage transistor.

One such example of a conventional high breakdown-voltage transistor is disclosed in Japan Patent Publication No. 2000-299390 and illustrated in FIG. 8.

Referring now to FIG. 8, a cross-sectional diagram of a conventional high breakdown-voltage transistor is set forth and given the general reference character 800.

Conventional high breakdown-voltage transistor 800 is a MOSFET (metal oxide semiconductor field effect transistor). Conventional high breakdown-voltage transistor 800 is formed in an element region defined by an element isolation region 54 on a silicon substrate 48. A gate electrode 52 is formed on the element region. A side-wall film 50 covers side surfaces of the gate 52. A well is formed in the semiconductor substrate 48. Incidentally, the boundary between the well and the semiconductor substrate 48 is not shown in FIG. 8. Low concentration source/drain regions 58 and high concentration source/drain regions 56 are formed in the well. An intra-substrate high-concentration contour line 60 indicates a peak of the impurity concentration of the well in the vicinity of the high concentration source/drain regions 56.

Conventional high breakdown-voltage transistor 800 can suffer from a decreased breakdown voltage as will now be explained.

First, there can be a large difference in silicon oxide film thickness of element isolation region 54 between ion implantation steps forming the well and the source/drain regions. Also, in a semiconductor device including complementary MOSFETs (CMOS) and non-volatile memory transistors (such as floating gate transistors), the thickness of a gate oxide film can vary greatly between the non-volatile memory transistors, a high break-down voltage transistor for controlling the non-volatile memory transistor, and CMOS transistors used for logic. To manufacture such a semiconductor device, gate oxidation and etching may be repeated many times. When a gate oxide film is etched, the silicon oxide film in an element isolation region (for example, element isolation region 54) is typically etched simultaneously. However, ions are typically implanted to form a well before gate oxidation and ions are typically implanted to from source/drain regions after the gate oxidation process are completed. This results in a large difference in thickness of the silicon oxide film in the element isolation region 54 between when the well-forming ions are implanted and when the source/drain forming ions are implanted.

The above-mentioned difference in thickness of the silicon oxide film can be particularly problematic when the element isolation region 54 has a moderate slope near an element region end 62. When an element isolation region 54 is formed by thermal oxidation at about 1100° C., the inclination of an element isolation region 54 may have such a moderate slope near the element region end 62. Also, a trench may be formed under conditions that cause a moderate slope and may then be filled with a silicon oxide film to form element isolation region 54 having a moderate slope near the element region end 62.

The reason why a sufficiently high breakdown voltage may not be obtained if the above-mentioned conditions occur will now be described with reference to FIG. 9.

Figure 9:
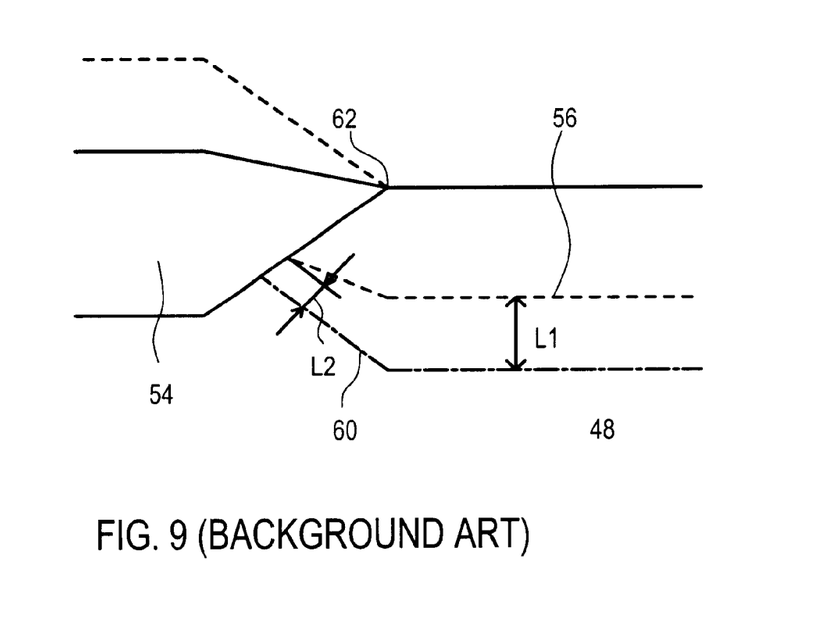
FIG. 9 is a cross sectional diagram of conventional high-voltage transistor in the vicinity of an element region end.

Referring now to FIG. 9, a cross section of conventional high-voltage transistor 800 in the vicinity of element region end 62 is set forth.

An upper surface of element isolation region 54 at the time of well-forming ion implantation is indicated by a broken line. At the time of source/drain forming ion implantation, the upper surface of element isolation region 54 is indicated by the solid line. The intra-substrate high-concentration contour line 60 produced in the substrate as a result of the well-forming ion implantation is indicated by a dot dashed line. The high concentration source/drain region 56 is indicated by another dashed line.

It is noted that due to the thick beveled shape of the element isolation region 54 at the time of well-forming ion implantation, the well tapers near the element region end 62 so that it is much more shallow. However, because the element isolation region 54 has a much thinner beveled shape at the time of the source/drain forming ion implantation, the high concentration source/drain region 56 does not taper as much, relative to the well. Due to this, a distance L1 between the high concentration source/drain region 56 and the intra-substrate high-concentration contour line 60 in a central area is greater than a distance L2 between the high concentration source/drain region 56 and the intra-substrate high-concentration contour line 60 near the element isolation region 54. This results in a decrease in a breakdown voltage of conventional high-voltage transistor 800.

Figure 10:
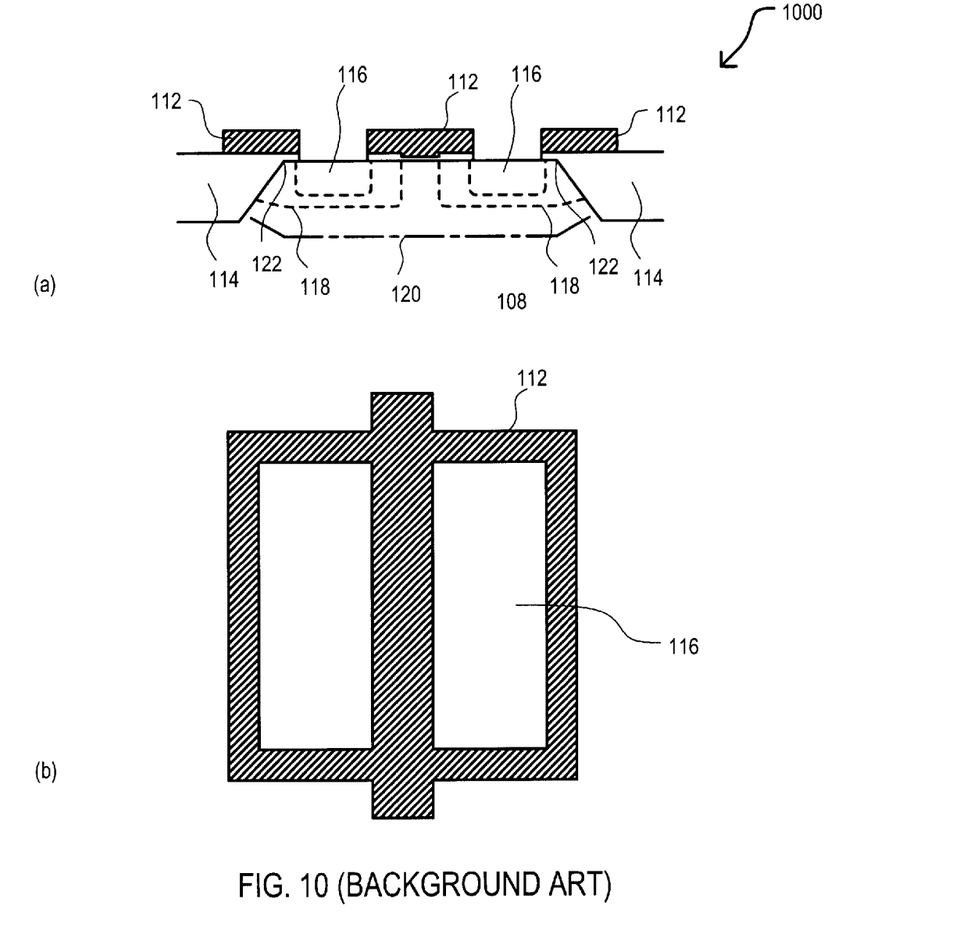
FIG. 10(a) is a cross-sectional diagram of a conventional high breakdown-voltage transistor.
FIG. 10(b) is a plan view of a conventional high-voltage breakdown transistor.

Another conventional high-voltage transistor is disclosed in Japan Patent Application laid-Open No. Hei 8-181223 and illustrated in FIG. 10.

In FIG. 10(a), a cross-sectional diagram of a conventional high breakdown-voltage transistor is set forth and given the general reference character 1000. In FIG. 10(b), a plan view of conventional high-voltage breakdown transistor 1000 is set forth.

Referring now to FIG. 10(a), conventional high-voltage breakdown transistor 1000 is a MOSFET. Conventional high breakdown-voltage transistor 1000 is formed in an element region defined by an element isolation region 114 on a silicon substrate 108. The transistor 1000 includes a low concentration source/drain region 118 and a high concentration source drain region 116, which are formed in a well, and a gate electrode 112. An intra-substrate high-concentration contour line 120 indicates a peak of the impurity concentration of the well in the vicinity of the high concentration source/drain regions 116.

In conventional high-voltage breakdown transistor 1000, gate 112 is also disposed over the element region end 122. This can prevent the high concentration source/drain region 116 from being formed at the element region end 122, so that the distance between the high concentration source/drain region 116 and the intra-substrate high concentration contour line 120 may not be reduced near the element region end 122.

Referring now to FIG. 10(b), the layout of the gate 112 is illustrated. Gate 112 is disposed over the element region end 122 (FIG. 10(a)). Thus, gate 112 is formed in a loop pattern. This can cause increased chip size as will be discussed below.

Figure 11:
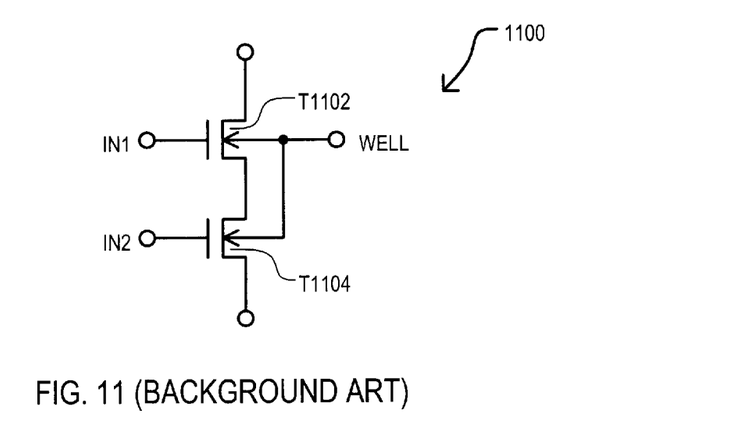
FIG. 11 is a schematic diagram of a circuit.

Referring now to FIG. 11, a schematic diagram of a circuit is set forth and given the general reference character 1100.

Circuit 1100 includes transistors (T1102 and T1104) connected in series. Transistor T1102 has a control gate connected to receive input IN1 and transistor T1104 has a control gate connected to receive input IN2. Circuit 1100 may illustrate a common construction of transistors, such as high-voltage breakdown transistors in a semiconductor device, such as a non-volatile semiconductor memory device, as just one example.

Conventional high-voltage breakdown transistor 1000, as illustrated in FIG. 10, cannot be arranged so that two transistors are arranged in series and sharing the same source/drain region. This is due to the gate 112 being disposed over the element region end 122. In order to construct circuit 1100 with two conventional high-voltage breakdown transistors 1000, two separate source/drain regions 116 must be used, one source/drain region for each conventional high-voltage breakdown transistor 1000. The source/drain regions may then be electrically connected with an interconnect layer. Such a configuration takes up much more chip area than a configuration in which two transistors share the same source/drain region Another drawback to conventional high-voltage breakdown transistor 1000, as illustrated in FIG. 10, is that the gate oxide film may be subjected to etching during the etching of a silicon nitride film. In this case, a gate oxide film having a large thickness (50–100 nm) can be implemented but a small gate oxide thickness (20–30 nm) may be difficult to reliably implement due to film thickness control.

In view of the above discussion, it would be desirable to provide a semiconductor device that may be capable of obtaining a sufficient high breakdown voltage. It would also be desirable to provide the semiconductor device while including semiconductor devices that may not operate at a high voltage. It would also be desirable to provide the semiconductor device included on a semiconductor memory device including non-volatile memory cells.

SUMMARY OF THE INVENTION

According to the present embodiments, a semiconductor device including an insulated gate field effect transistor (IGFET) is disclosed. The IGFET may be formed in an element region defined by an element isolation region formed on a semiconductor substrate. A covering portion may cover at least a portion of an end of the element region. A covering portion may be formed essentially of the same material as a side wall of a gate of an IGFET. A source/drain region may be formed using a gate and the covering portion as a mask. In this way, a distance between an intra-substrate high-concentration region and a source/drain region in an end area of the element region may remain sufficient and an IGFET breakdown voltage may be improved.

According to one aspect of the embodiments, a semiconductor device may include an insulated gate field effect transistor (IGFET) formed in an element region defined by an element isolation region. A covering portion may cover at least an end portion of the element region and may be formed from the substantially the same material as a side wall formed on a side surface of a gate of the IGFET According to another aspect of the embodiments, the covering portion may provide a mask during the formation of a source/drain region of the IGFET.

According to another aspect of the embodiments, the formation of the source/drain region may include the formation of a high impurity concentration region and the formation of a low impurity concentration region and the covering portion may provide a mask during the formation of the high impurity concentration region.

According to another aspect of the embodiments, a second IGFET, which shares the source/drain region, may be formed.

According to another aspect of the embodiments, the covering portion may include a silicon oxide film.

According to another aspect of the embodiments, the covering portion may be formed in a ring along an end of the element region.

According to another aspect of the embodiments, the covering portion may cover at least a portion of the element isolation region.

According to another aspect of the embodiments, a semiconductor device may include a non-volatile memory transistor, a first insulated gate field effect transistor (IGFET), and a high breakdown-voltage IGFET. The high breakdown-voltage IGFET may be formed in an element region defined by an element isolation region. A covering portion may cover at least an end of the element region. The covering portion may be formed from essentially the same material as a side wall formed on a side surface of a gate of at least one of the group including the non-volatile memory transistor, the first IGFET and the high breakdown-voltage IGFET. The covering portion may provide a mask during the formation of a source/drain region of the high breakdown-voltage IGFET.

According to another aspect of the embodiments, the covering portion may include a silicon oxide film.

According to another aspect of the embodiments, the first IGFET may be included in a first circuit coupled to receive a first power supply potential greater than a ground potential. The high breakdown-voltage IGFET may be included in a second circuit coupled to receive a second power supply potential higher than the first power supply potential.

According to another aspect of the embodiments, the second circuit may be coupled to provide a write potential to the non-volatile memory transistor.

According to another aspect of the embodiments, a second high breakdown-voltage IGFET, which shares the source/drain region, may be formed in the well.

According to another aspect of the embodiments, the covering portion may be in the form of a ring along an end of the element region.

According to another aspect of the embodiments, the covering portion may cover at least a portion of the element isolation region.

According to another aspect of the embodiments, a semiconductor device may include a plurality of insulated gate field effect transistors (IGFETs) including a first IGFET. The first IGFET may be formed in an element region defined by an element isolation region formed on a semiconductor substrate. A method for manufacturing the semiconductor device may include the steps of using a first gate of the first IGFET as a mask to form a first source/drain region having a first impurity concentration, forming a first side wall on a side surface of a gate of at least one of the plurality of IGFETs while forming a covering portion that covers at least an end of the element region, and using the gate of the first IGFET, the first side wall and the covering portion as a mask to form a second source/drain region having a second impurity concentration in the first source/drain region. A second impurity concentration may be higher than the first impurity concentration.

According to another aspect of the embodiments, the plurality of IGFETs may include a non-volatile memory transistor and a second IGFET. The second IGFET may be included in a first circuit coupled to receive a first power supply potential. The first power supply potential may be greater than a ground potential. The first IGFET may be included in a second circuit coupled to receive a second power supply potential. The second power supply potential may be greater than the first power supply potential.

According to another aspect of the embodiments, the step of forming the first side wall may include forming the first side wall on the gate of the first IGFET.

According to another aspect of the embodiments, the step of forming the first side wall may include forming the first side wall on the gate of the second IGFET.

According to another aspect of the embodiments, the step of forming the first side wall may include forming the first side wall on the gate of the non-volatile memory transistor.

According to another aspect of the embodiments, the covering portion may include a silicon oxide film.

DETAILED DESCRIPTION OF THE EMBODIMENTS

Various embodiments of the present invention will now be described in detail with reference to a number of drawings.

First Embodiment

FIGS. 1 to 4 illustrate a first embodiment of a semiconductor device and method for manufacturing the same according to the present invention.

Figure 1:
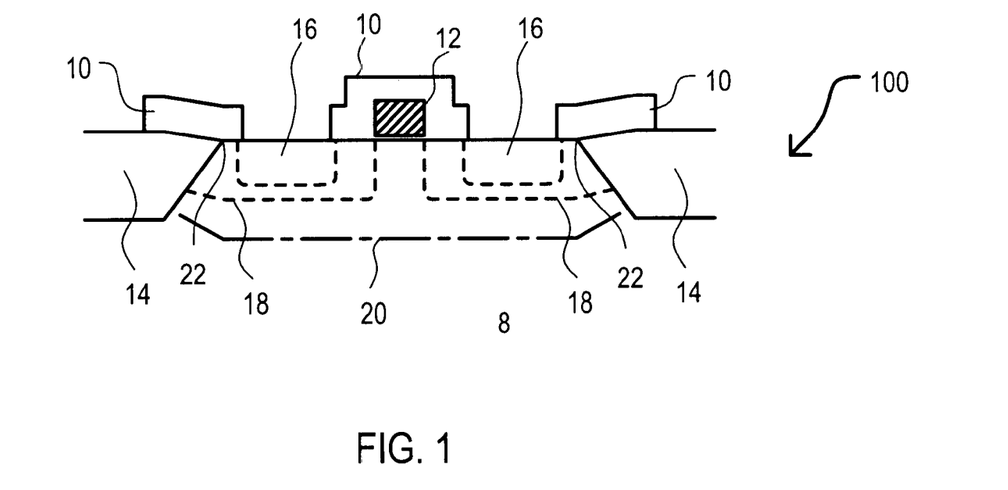
FIG. 1 is a cross-sectional diagram of a semiconductor memory device according to an embodiment.
Figure 2:
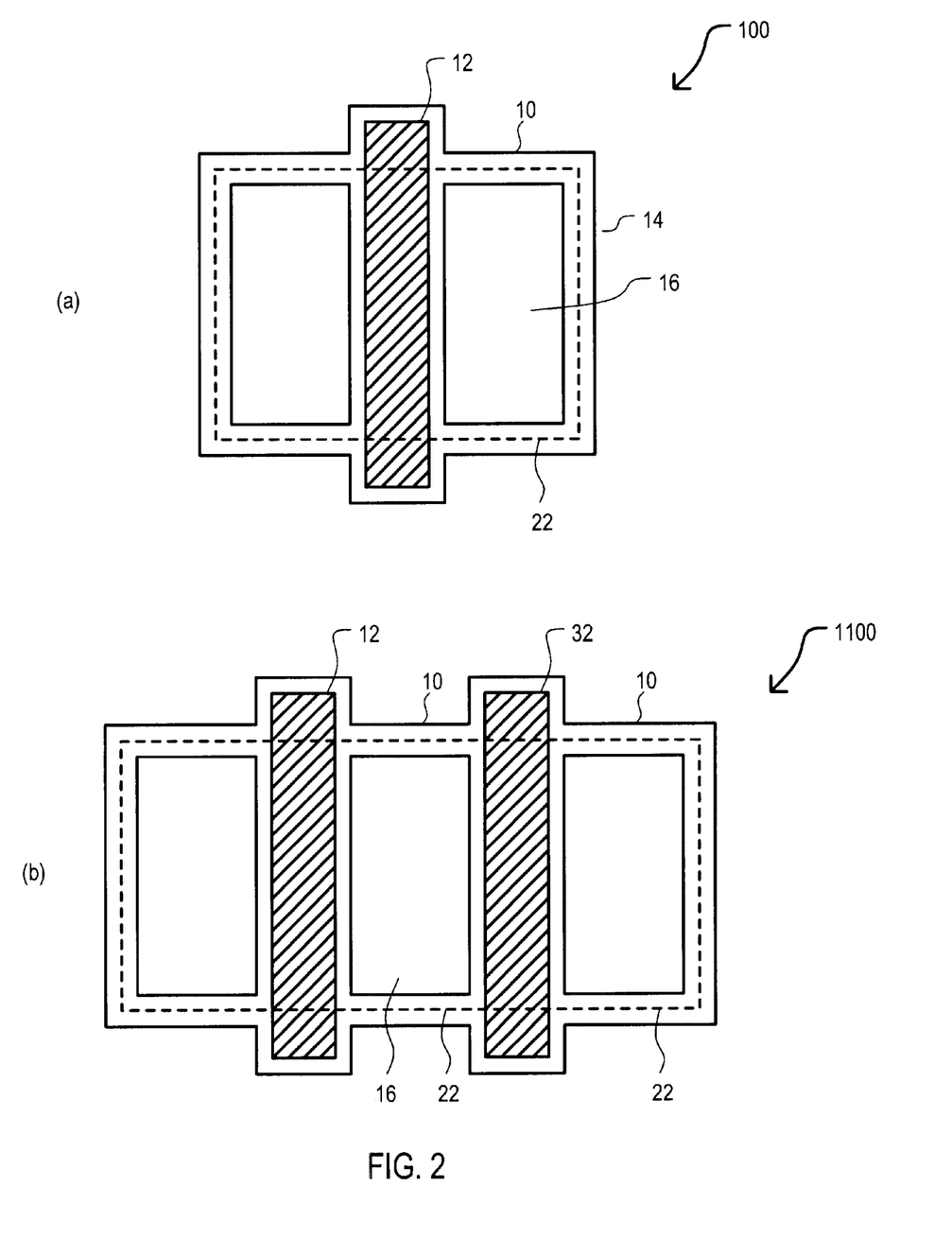
FIG. 2(a) is a top plan view of a semiconductor device according to an embodiment.
FIG. 2(b) is a top plan view of a circuit incorporating semiconductor devices according to an embodiment.

Referring now to FIG. 1, a cross-sectional diagram of a semiconductor device according to an embodiment.

Semiconductor device may include a high breakdown-voltage insulated gate field effect transistor (IGFET) 100 formed in an element region defined by an element isolation region 14 provided on a semiconductor substrate 8. A gate electrode 12 is formed on the element region. Covering portions 10 are provided for covering at least element region end 22. Covering portions 10 may be formed from the same material as a side-wall film 10 which covers side surfaces of the gate 12. A well is formed in the semiconductor substrate. Incidentally, the boundary between the well and the semiconductor substrate 8 is not shown in FIG. 1. Low concentration source/drain regions 18 and high concentration source/drain regions 16 are formed in the well. An intra-substrate high-concentration contour line 20 indicates a peak of the impurity concentration of the well in the vicinity of the high concentration source/drain regions 16.

A method of manufacturing the high breakdown-voltage IGFET 100 will now be described with reference to FIGS. 3 and 4.

Figure 3:
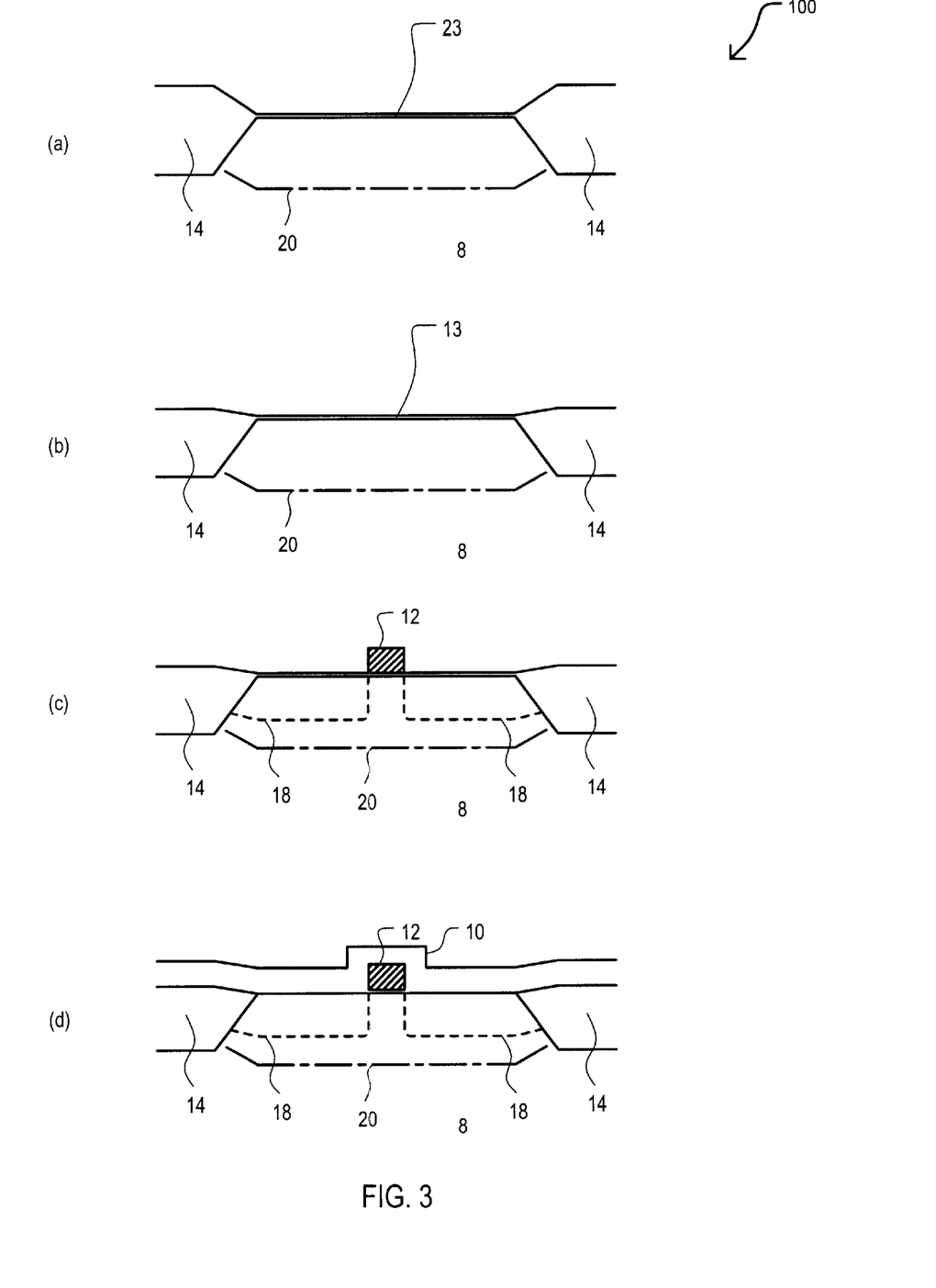
FIGS. 3(a)–3(d) are cross sectional diagrams of a semiconductor device according to an embodiment after various processing steps.
Figure 4:
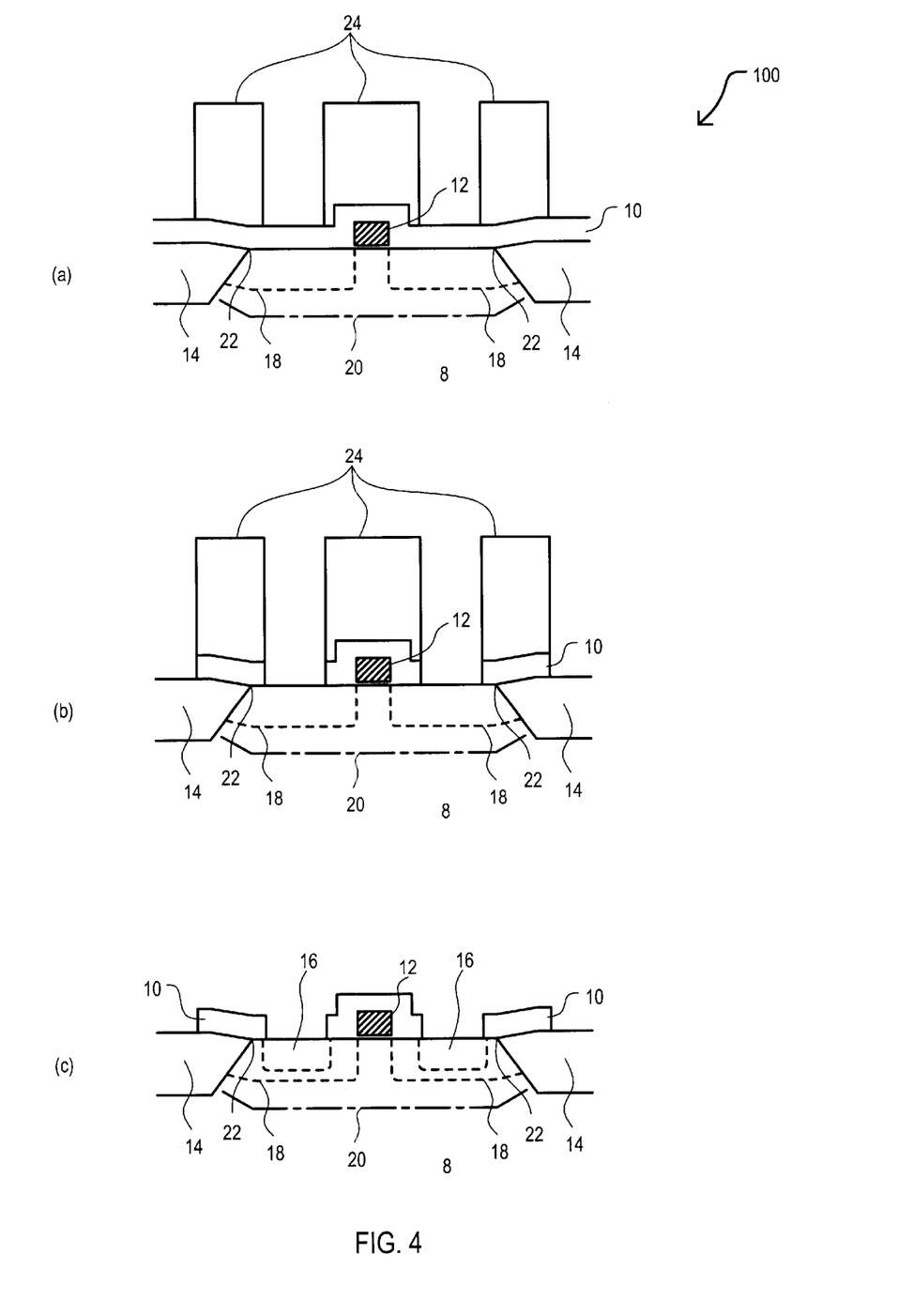
FIGS. 4(a)–4(c) are cross sectional diagrams of a semiconductor device according to an embodiment after various processing steps.

FIGS. 3 and 4 are cross sectional diagrams of IGFET 100 after various processing steps.

Referring now to FIG. 3(a), thermal oxidation may be conducted on semiconductor substrate 8 at about 1100° C. with a silicon nitride left only in an element region. In this way, element isolation region 14 may be formed as a silicon oxide film. The silicon nitride film may then be removed. A portion of the silicon oxide film may be removed during the removal of the silicon nitride film. A thermal oxidation may then be conducted to form a thin silicon oxide film. Ions may then be implanted into the silicon substrate 8 in order to form a well. The intra-substrate high-concentration contour line 20 is provided in the substrate 8 as a result of this well-forming ion implantation.

Referring now to FIG. 3(b), the above-mentioned thin silicon oxide film may then be etched and a gate oxide film 23 for a non-volatile memory transistor (not shown) may then be formed by oxidation. A gate (not shown), such as a floating gate for the non-volatile memory transistor may then be formed. The gate oxide 23 film may then be etched and a gate oxide film 13 for the high breakdown-voltage transistor 100 may then be formed. During the above-mentioned etching steps, the silicon oxide film composing element isolation region 14 may be etched and thinned as illustrated in FIG. 3(b).

Referring now to FIG. 3(c), a gate electrode film may be formed on silicon substrate 8 and then patterned with photolithography and etching to form a gate electrode 12. Subsequently, ions may be implanted into the substrate silicon 8 using gate electrode 12 as a mask. In this way, low-concentration source/drain regions 18 may be formed.

Referring now to FIG. 3(d), a silicon oxide film 10 may be formed on the silicon substrate 8.

Referring now to FIG. 4(a), a photo-resist 24 may be patterned by photolithography, or the like, to cover gate electrode 12 and element region end 22, while exposing other portions of silicon oxide film 10.

Referring now to FIG. 4(b), anisotropic etching may then be conducted to remove exposed portions of silicon oxide film 10.

Referring now to FIG. 4(c), photo-resist 24 may be removed and ions may be implanted at a high dosage to form high concentration source/drain regions 16 while using silicon oxide film 10, including covering portions over element region end 22, as a mask.

By employing a covering portion over element region end 22, high concentration source/drain regions 16 may be formed while being spaced from element region end 22. In this way, high concentration source/drain regions 16 may not be formed in a region where intra-substrate high-concentration contour line 20 may be shallow. By doing so, a breakdown voltage may not be reduced.

Other steps including ordinary wiring steps may then be conducted to complete a semiconductor device.

Although a thermal oxidation step (local oxidation of silicon—LOCOS) has been employed to form element isolation region 14, a trench may be formed in the silicon substrate and filled with a silicon oxide film (shallow trench isolation—STI), as just one example.

Although, in this embodiment, silicon oxide film 10 forming covering portion has been formed in a ring shape over an element region end 22, silicon oxide film 10 may be formed to cover all of element isolation region 14, as just one example.

Although covering portion over element region end 22 has been formed with a silicon oxide film 10 that is also used as a gate sidewall oxide of a high breakdown-voltage IGFET, covering portion may be made of a different material.

Referring now to FIG. 2(a), a top plan view of high breakdown-voltage IGFET 100 according to an embodiment is set forth.

FIG. 2(a) illustrates element region end 22, covering portion 10 over element isolation region end 22 formed by silicon oxide film, high concentration source/drain regions 16 and gate electrode 12. The covering portion 10 is formed in a ring shape over the element region end 22.

Referring now to FIG. 2(b), circuit 1100 as illustrated in FIG. 11 is constituted by using an IGFET according to an embodiment is set forth.

FIG. 2(b) illustrates element region end 22, covering portion 10 over element isolation region 22 formed by silicon oxide film, a gate electrode 12 of one IGFET and a gate electrode 32 of another IGFET, in the circuit 1100 as illustrated in FIG. 11.

Gate electrode 12 may be a gate of for example IGFET T1102 and gate electrode 32 may be a gate of for example IGFET T1104 of circuit 1100. In this way, a circuit 1100 in which high break-down voltage IGETs may be formed in series and sharing the same source/drain region 16 in accordance with an embodiment. By doing so, chip area may be reduced as compared to the conventional approach illustrated in FIG. 10.

Second Embodiment

Figure 5:
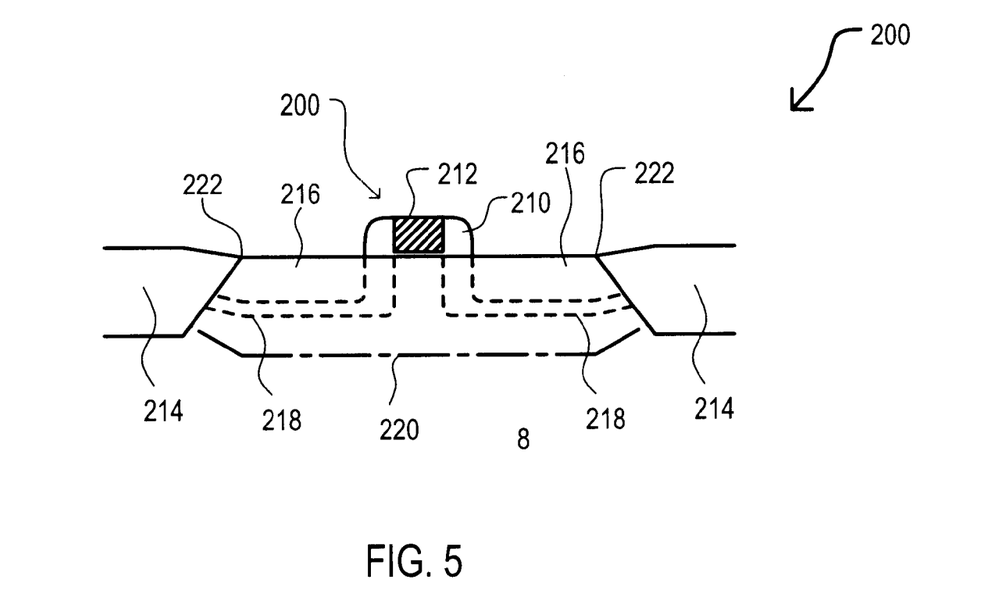
FIG. 5 is a cross sectional diagram of an IGFET of a semiconductor memory device in accordance with an embodiment.
Figure 6:
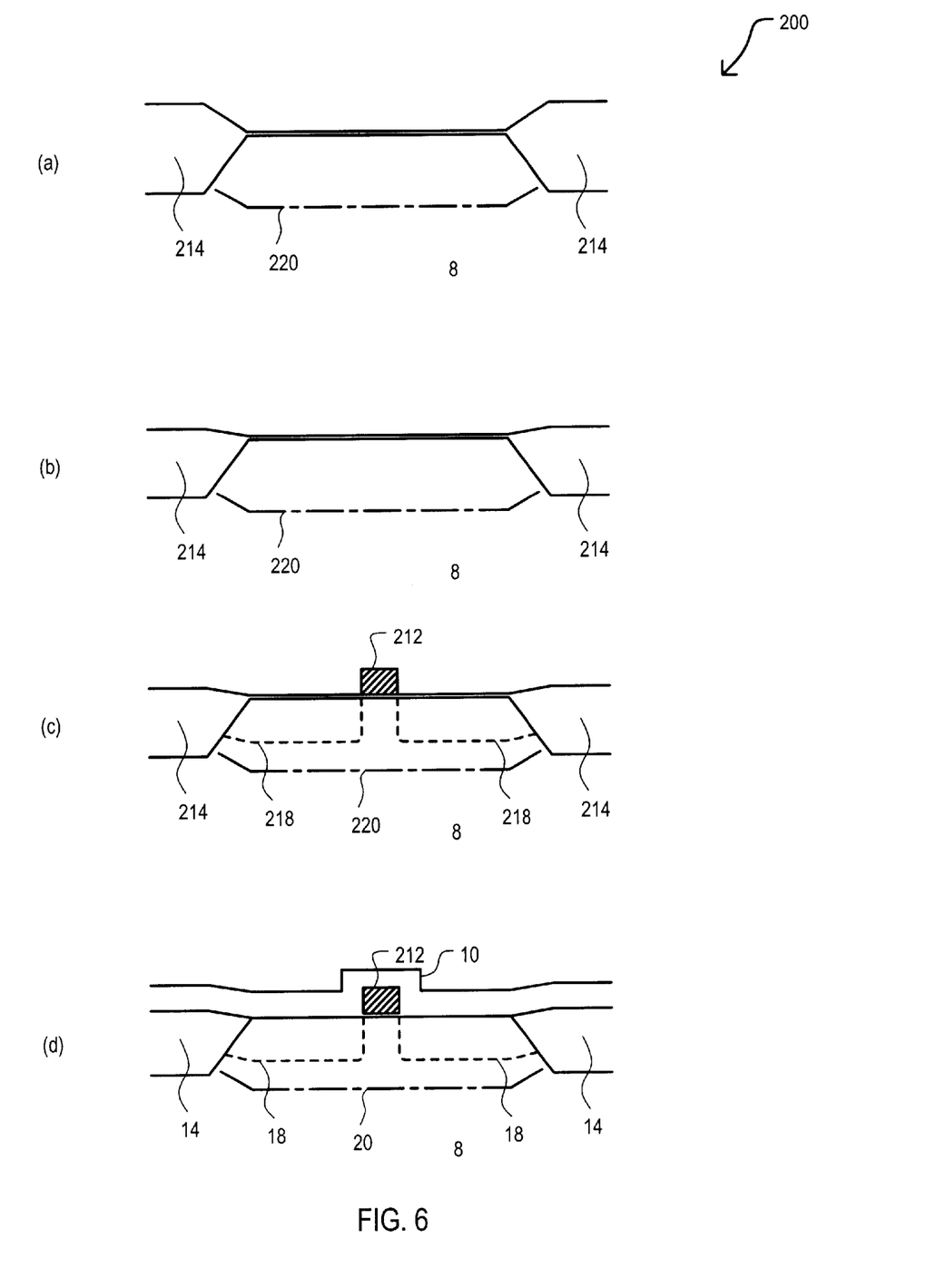
FIGS. 6(a)–6(d) are cross sectional diagrams of a semiconductor device according to an embodiment after various processing steps.
Figure 7:
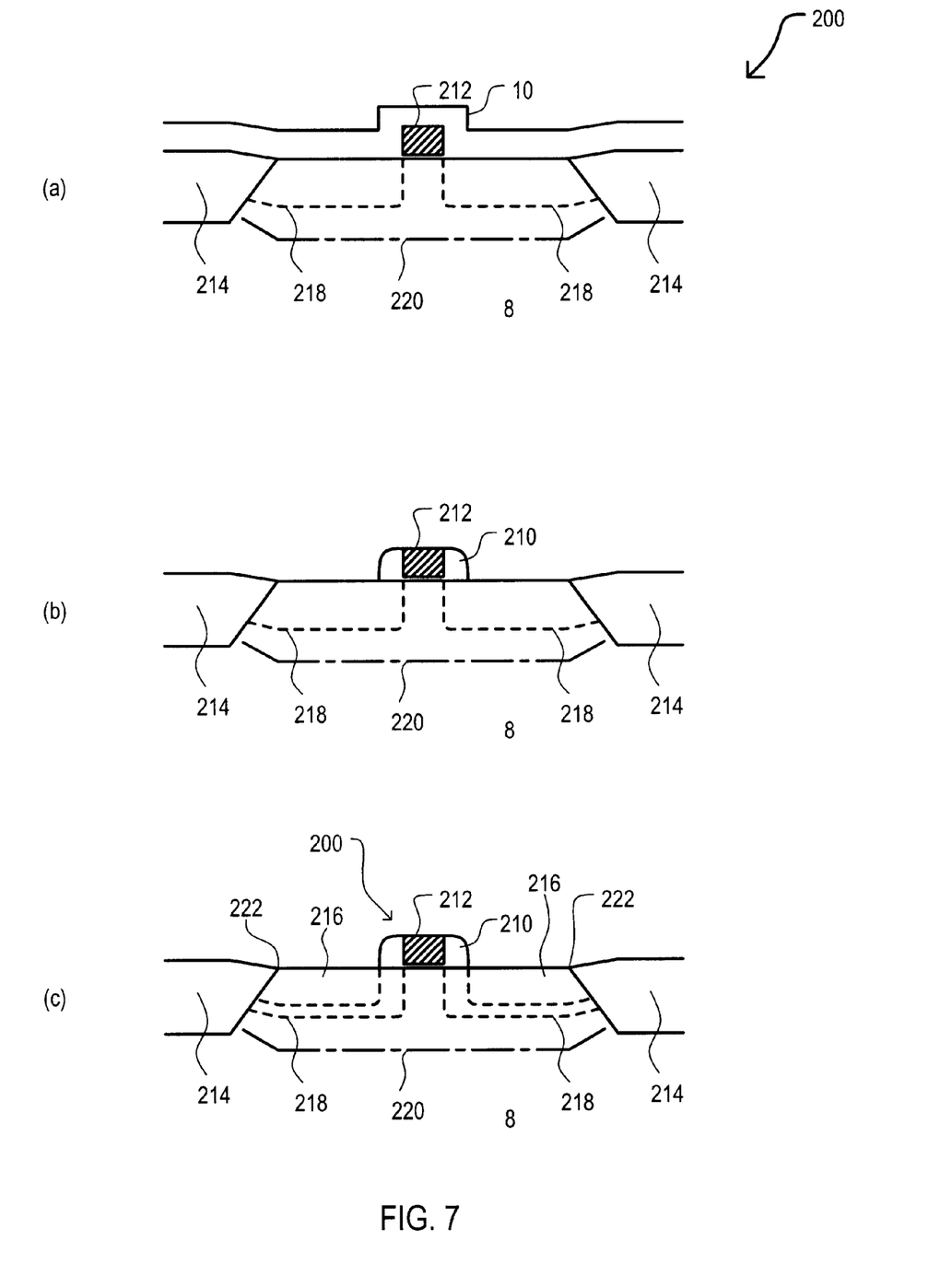
FIGS. 7(a)–(c) are cross sectional diagrams of a semiconductor device according to an embodiment after various processing steps.

FIGS. 5–7 illustrate a second embodiment of a semiconductor device according to the present invention.

FIG. 5 is a cross sectional diagram of an IGFET 200.

FIGS. 6 and 7 are cross sectional diagrams of IGFET 200 after various process steps.

In addition to a high breakdown voltage IGFET 100 is illustrated in FIG. 1, semiconductor device may include an IGFET 200. IGFET 200 may be a MOSFET, as just one example. Complementary MOSFETs may be formed, such as IGFET 200, and having opposite conductivities. In this way, p-type IGFETs and n-type IGFETs may be formed.

IGFET 200 may be formed in an element region as defined by an element isolation region 214 formed on a semiconductor substrate 8, in which the IGFET 100 is also formed. A gate electrode 212 is formed on the element region. Side-wall films 212 cover side surfaces of the gate 212. A well is formed in the semiconductor substrate 8. Incidentally, the boundary between the well and the semiconductor substrate 8 is not shown in FIG. 5. Low concentration source/drain regions 218 and high concentration source/drain regions 216 are formed in the well. An intra-substrate high-concentration contour line 220 indicates a peak of the impurity concentration of the well in the vicinity of the high concentration source/drain regions 216.

Side-wall 210 material may be used as a covering portion 10 covering at least an element region end 22 in the IGFET 100 as illustrated in FIG. 1 formed additionally on semiconductor device. Alternatively, covering portion 10 may be formed by a material for forming a side-wall of a gate of a non-volatile memory transistor (not shown) which may also be included on semiconductor device.

Gate side-walls of complementary IGFETs, a non-volatile memory transistor, and a high breakdown-voltage IGFET may all be formed from substantially the same material.

FIGS. 6(a) to 7(c) corresponds to FIGS. 3(a) to 4(c), respectively.

Referring now to FIGS. 6(a) to 6(d), intra-substrate high-concentration contour line 220, element isolation region 214, gate electrode 212, low-concentration source/drain regions 218, and silicon oxide film 10 may be substantially formed in conjunction with formation of intra-substrate high-concentration contour line 20, element isolation region 14, gate electrode 12, low-concentration source/drain regions 18, and silicon oxide film 10 of high breakdown-voltage transistor as illustrated in FIGS. 3(a) to 3(d).

Referring to FIG. 7(a), the IGFET 200 is not covered by the photo-resist 24 shown in FIG. 4(a).

Referring to FIG. 7(b), anisotropic etching may then be conducted to the silicon oxide film 10 to form gate sidewalls 210 on the side surfaces of the gate electrode 212 in conjunction with formation of covering portion 10 over element region end 22.

Referring now to FIG. 7(c), high-concentration source-drain regions 216 may be formed in conjunction with formation high-concentration source-drain regions 16 illustrated in FIG. 4(c).

In this way, a high voltage IGFET 100 as illustrated in FIG. 1 and an IGFET 200 as illustrated in FIG. 5 may be formed on a same semiconductor substrate. IGFET 200 may not be formed with a covering portion 10 over element region end 222. In this way, high-concentration source-drain regions 216 may be formed adjacent to element isolation region 214 and may be formed in a region where intra-substrate high-concentration contour line 220 may be more shallow. However, IGFET 200 may be used in circuitry in which relatively high voltages may not be applied.

As illustrated in a second embodiment, a semiconductor device 400 may include a high breakdown-voltage IGFET 100 and an IGFET 200, including complementary type IGFETs. Also, a non-volatile memory cell may include a non-volatile memory transistor. A non-volatile memory transistor may include an electrically programmable floating gate device, as just one example. Non-volatile memory transistor may be required to operate at a relatively high voltage in a write or erase operation, as just two examples. High breakdown-voltage IGFET may be used in circuits providing such a relatively high voltage. IGFET 200 may be used in peripheral circuits that may not be required to operate at a relatively high voltage.

IGFET 200 may be used in a peripheral circuit operating at a first power supply potential. High breakdown-voltage IGFET may be used in a circuit that may operate at a second power supply potential, higher than the first power supply potential, as just one example.

High breakdown-voltage IGFET may be an n-type IGFET or a p-type IGFET, as just two examples.

It is understood that the embodiments described above are exemplary and the present invention should not be limited to those embodiments. Specific structures should not be limited to the described embodiments.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor device including an insulated gate field effect transistor (IGFET) formed in a element region defined by an element isolation region, comprising:

a covering portion that covers at least an end portion of the element region and formed from substantially the same material as a side wall formed on a side surface of a gate of the IGFET, the covering portion being a source/drain region formation mask for the IGFET.

2. The semiconductor device according to claim 1, wherein:

the formation of the source/drain region includes the formation of a high impurity concentration region and the formation of a low impurity concentration region and the covering portion provides a mask during the formation of the high impurity concentration region.

3. The semiconductor device according to claim 1, further including:

a second IGFET sharing the source/drain region.

4. The semiconductor device according to claim 1, wherein:

the covering portion includes as silicon oxide film.

5. The semiconductor device according to claim 1, wherein:

the covering portion is formed in a ring along an end of the element region.

6. The semiconductor memory device according to claim 1, wherein:

the covering portion covers at least a portion of the element isolation region.

7. A semiconductor device, comprising:

a non-volatile memory transistor, a first insulated gate field effect transistor (IGFET), and a high breakdown-voltage IGFET;

the high breakdown-voltage IGFET is formed in an element region defined by an element isolation region; and a covering portion that covers at least an end of the element region wherein the covering portion is formed from essentially the same material as a side wall formed on a side surface of a gate of at least one of the group consisting of the non-volatile memory transistor, the first IGFET and the high breakdown-voltage IGFET, and the covering portion provides a mask during the formation of a source/drain region of the high breakdown-voltage IGFET.

8. The semiconductor device according to claim 7, wherein:

the covering portion includes a silicon oxide film.

9. The semiconductor according to claim 7, wherein:

the first IGFET is included in a first circuit coupled to receive a first power supply potential greater than a ground potential; and the high breakdown-voltage IGFET is included in a second circuit coupled to receive a second power supply potential higher than the first power supply potential.

10. The semiconductor device according to claim 9, wherein:

the second circuit is coupled to provide a write potential to the non-volatile memory transistor.

11. The semiconductor device according to claim 7, further including:

a second high breakdown-voltage IGFET sharing the source/drain region.

12. The semiconductor device according to claim 7, wherein:

the covering portion is in the form of a ring along an end of the element region.

13. The semiconductor device according to claim 7, wherein:

the covering portion covers at least a portion of the element isolation region.

* * * * *